United States Patent
Tsironis

(10) Patent No.: US 11,480,589 B1
(45) Date of Patent: Oct. 25, 2022

(54) WAFER PROBE INTEGRATION WITH LOAD PULL TUNER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 17/232,603

(22) Filed: Apr. 16, 2021

(51) Int. Cl.
  *G01R 31/28* (2006.01)
  *G01R 1/067* (2006.01)

(52) U.S. Cl.
  CPC ..... *G01R 1/06788* (2013.01); *G01R 1/06794* (2013.01); *G01R 31/2891* (2013.01)

(58) Field of Classification Search
  CPC ............ G01R 1/06788; G01R 1/06794; G01R 31/2891
  See application file for complete search history.

(56) References Cited

U.S. PATENT DOCUMENTS

| | | | |
|---|---|---|---|
| 6,674,293 B1 | 1/2004 | Tsironis | |
| 9,335,345 B1 | 5/2016 | Tsironis | |
| 9,653,332 B1 | 5/2017 | Tsironis | |
| 9,899,984 B1 * | 2/2018 | Tsironis | G01R 31/2822 |
| 10,686,239 B1 | 6/2020 | Tsironis | |
| 11,125,777 B1 * | 9/2021 | Tsironis | G01R 27/06 |

OTHER PUBLICATIONS

"Load Pull" [online] Wikipedia, [Retrieved on Aug. 24, 2017], Retrieved from Internet <URL: https://en.wikipedia.org/wiki/Load_pull>, 2 pages.
"Computer Controlled Microwave Tuner, CCMT", Product Note 41, Focus Microwaves Inc. 1998, pp. 2-4, 20 pages.
"Standing wave ratio" [online], Wikipedia, [Retrieved on Feb. 3, 2017]. Retrieved from Internet <URL: https://en.wikipedia.org/wiki/Standing_wave_ratio>, 5-pages.
"MPT, a universal Multi-Purpose Tuner", Product Note 79, Focus Microwaves Inc., Oct. 2004, 9 pages.
"On Wafer Load Pull Tuner Setups: A Design Help", Application Note 48, Focus Microwaves, Dec. 2001, p. 2 ff., Figure 2, 5 pages.
Load Pull Characterization, White Paper #64, Focus Microwaves Inc. , Chapter 2, pp. 13-15, Chapter 9, pp. 43-49.

* cited by examiner

*Primary Examiner* — Paresh Patel

(57) ABSTRACT

Integrating a bracket with planarity adjustment holding a wafer probe securely, with a low-profile impedance tuner that is mounted on a 3-axis tuner positioner under an angle matching the angle of the wafer probe. The low-profile tuner has its tuning probe operating as close as physically possible within the distance of an RF adapter from the wafer-probe and is connected directly with the wafer-probe. This integration offers the maximum possible tuning range, while simultaneously offering planarity (THETA) control. It also eliminates the need for an extension RF cable between the instrument (tuner) and the wafer-probe, including a set of two coaxial adapters.

5 Claims, 19 Drawing Sheets

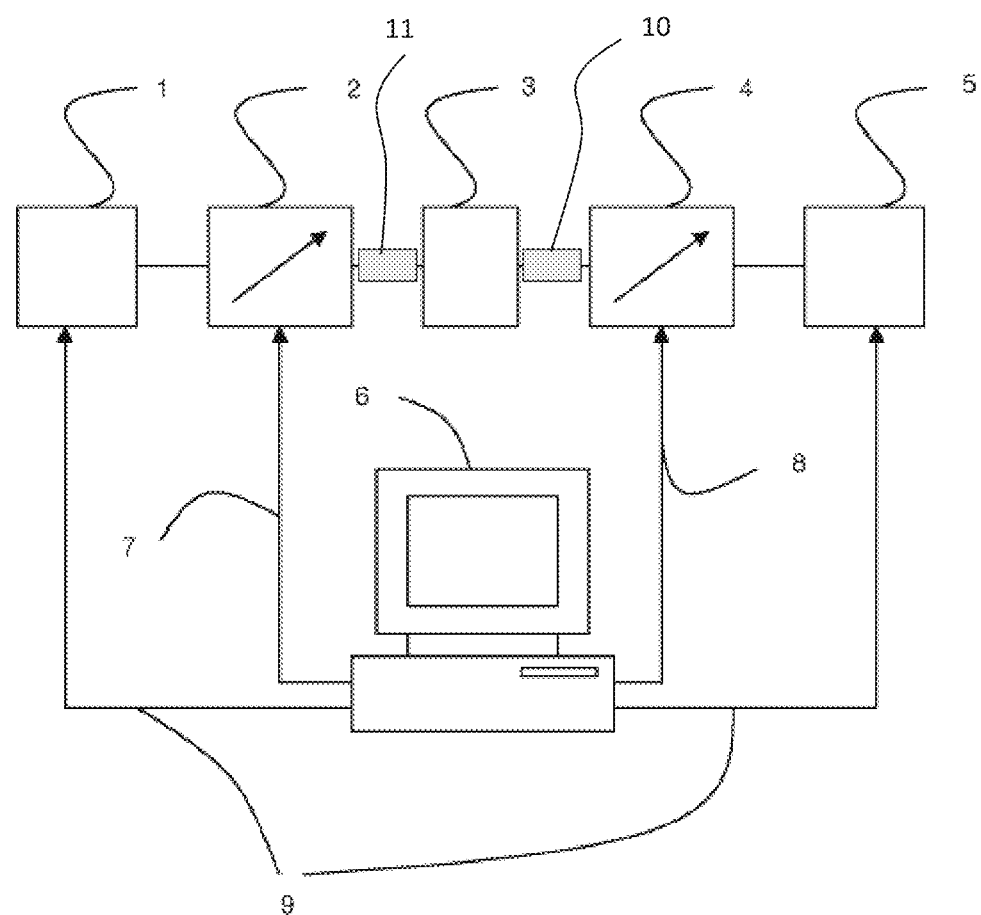
FIG. 1: Prior art

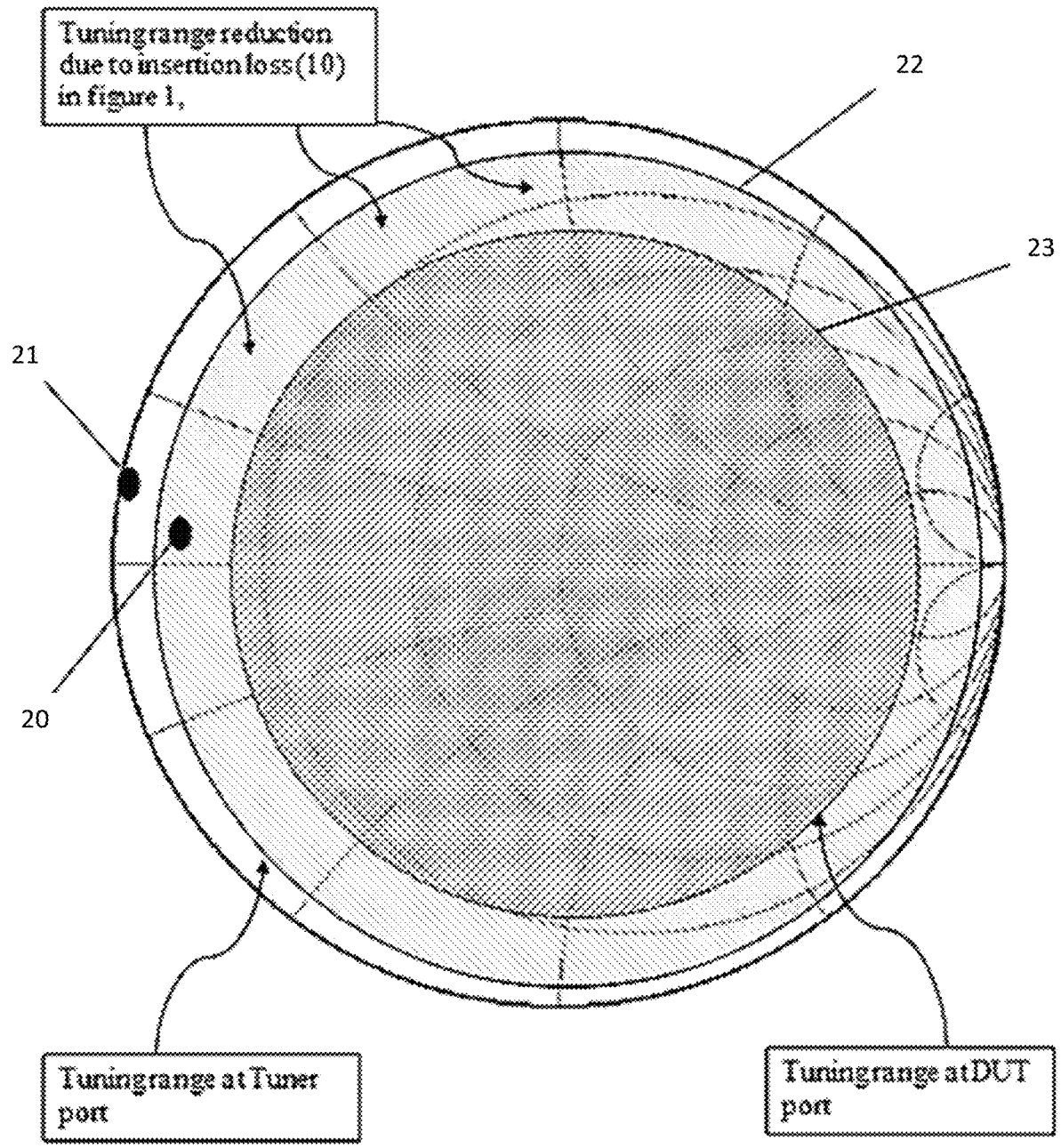
FIG. 2: Prior art

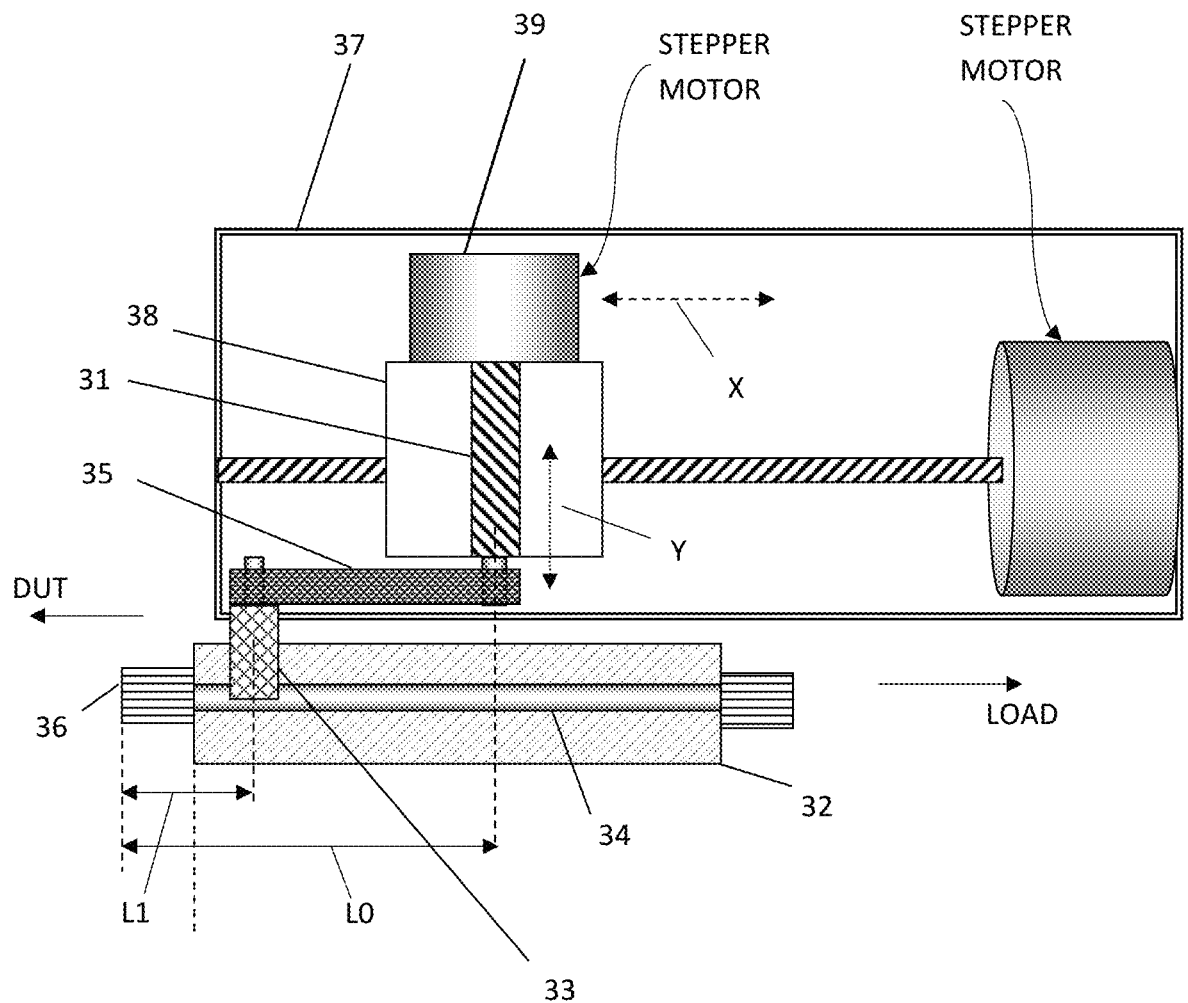
FIG. 3: Prior art

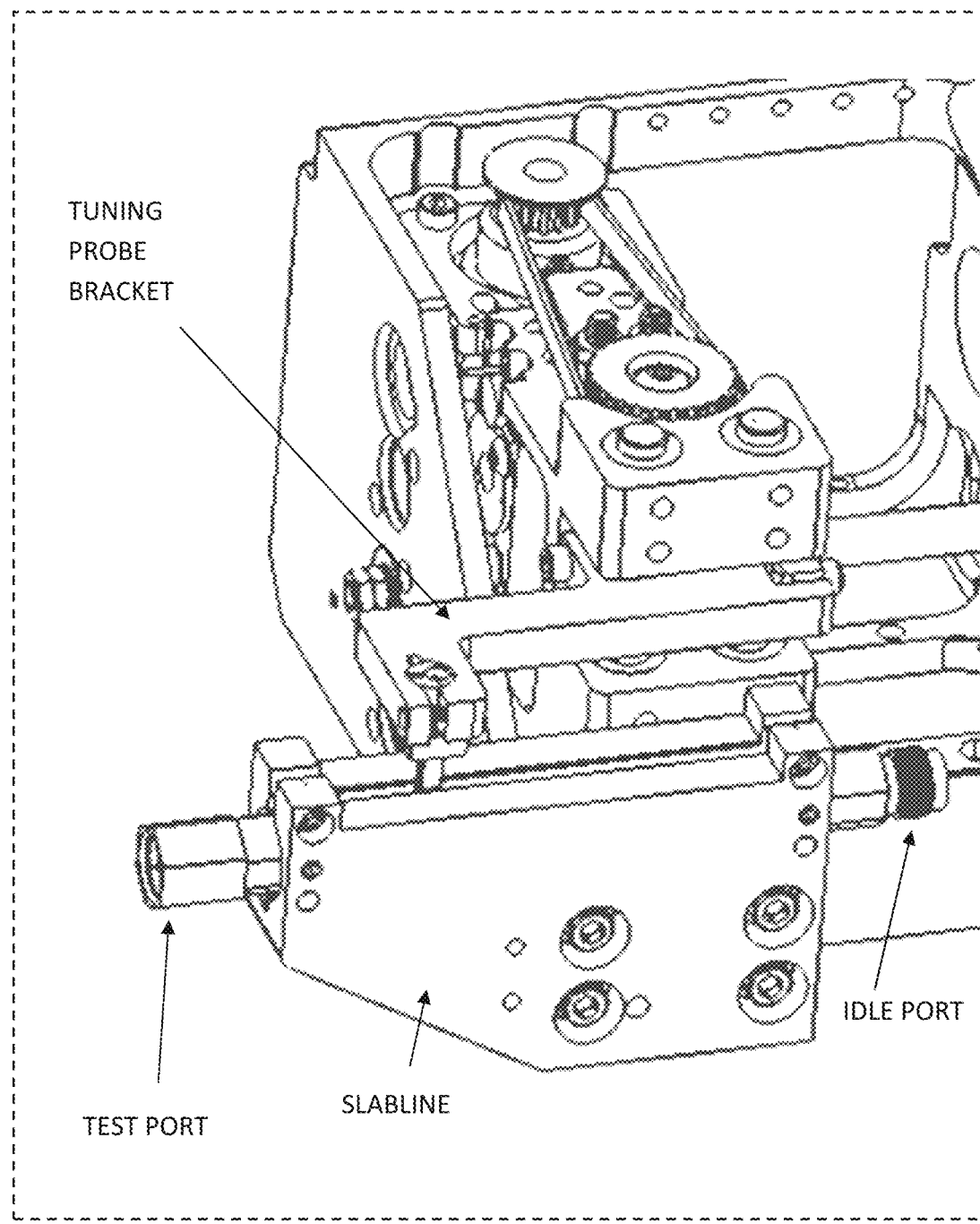
FIG. 4: Prior art

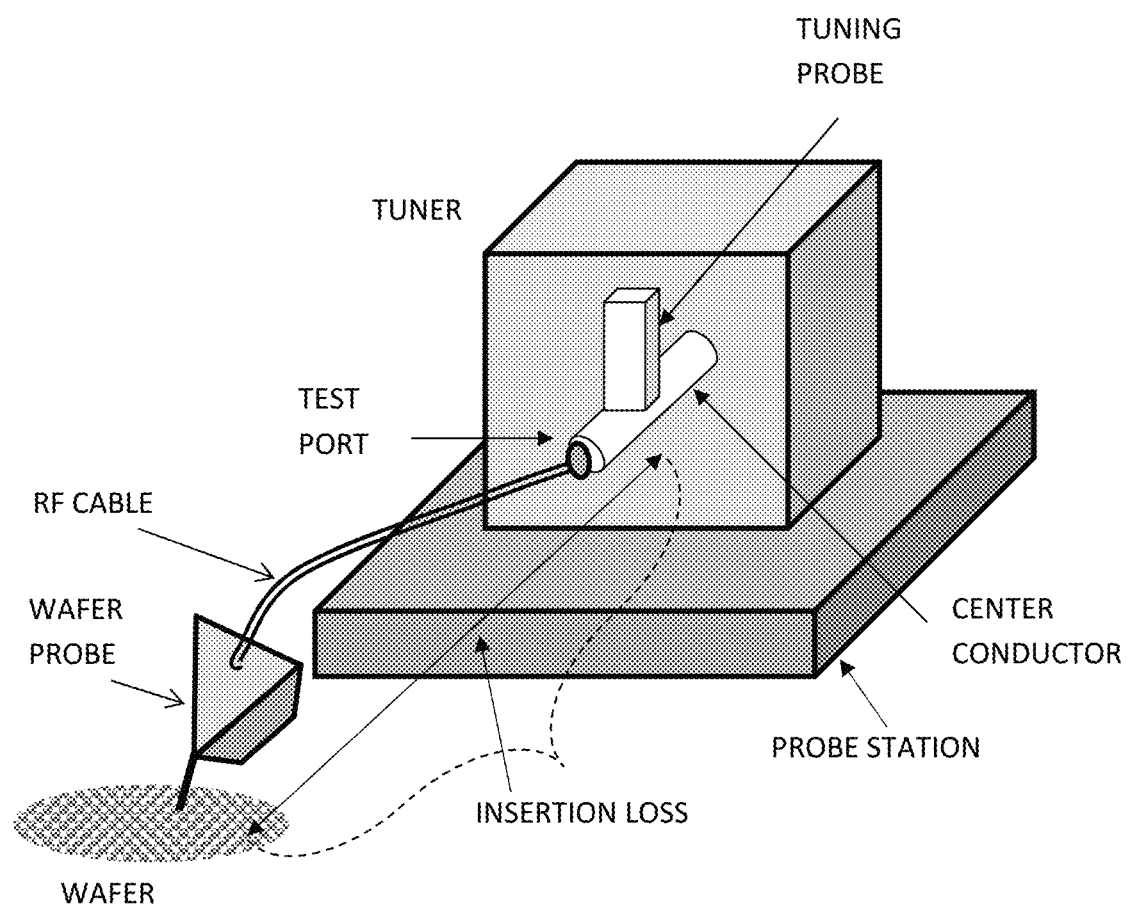
FIG. 5: Prior art

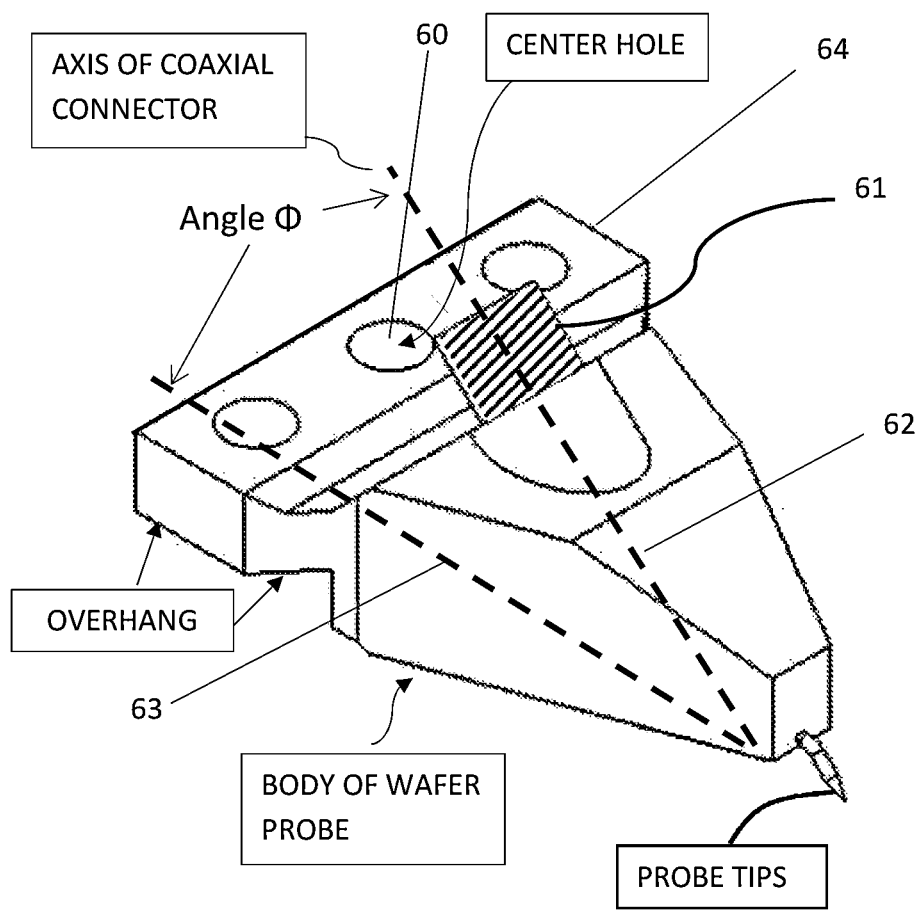
FIG. 6: Prior art

FIG.7A: Prior art
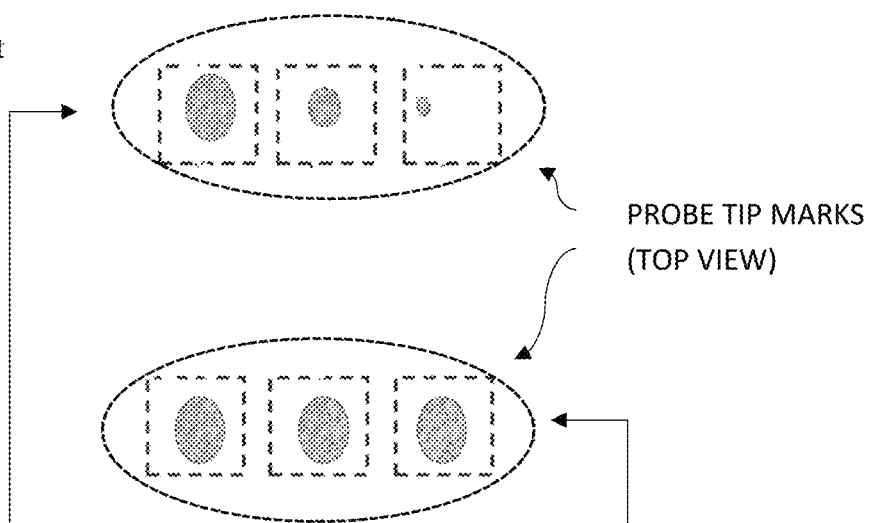
PROBE TIP MARKS (TOP VIEW)
FIG.7B: Prior art
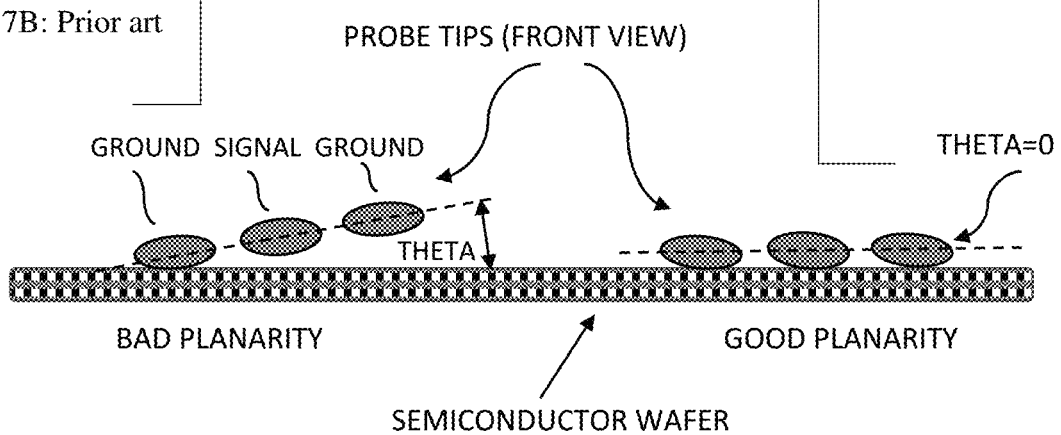
PROBE TIPS (FRONT VIEW)
GROUND SIGNAL GROUND
THETA
THETA=0
BAD PLANARITY
GOOD PLANARITY
SEMICONDUCTOR WAFER

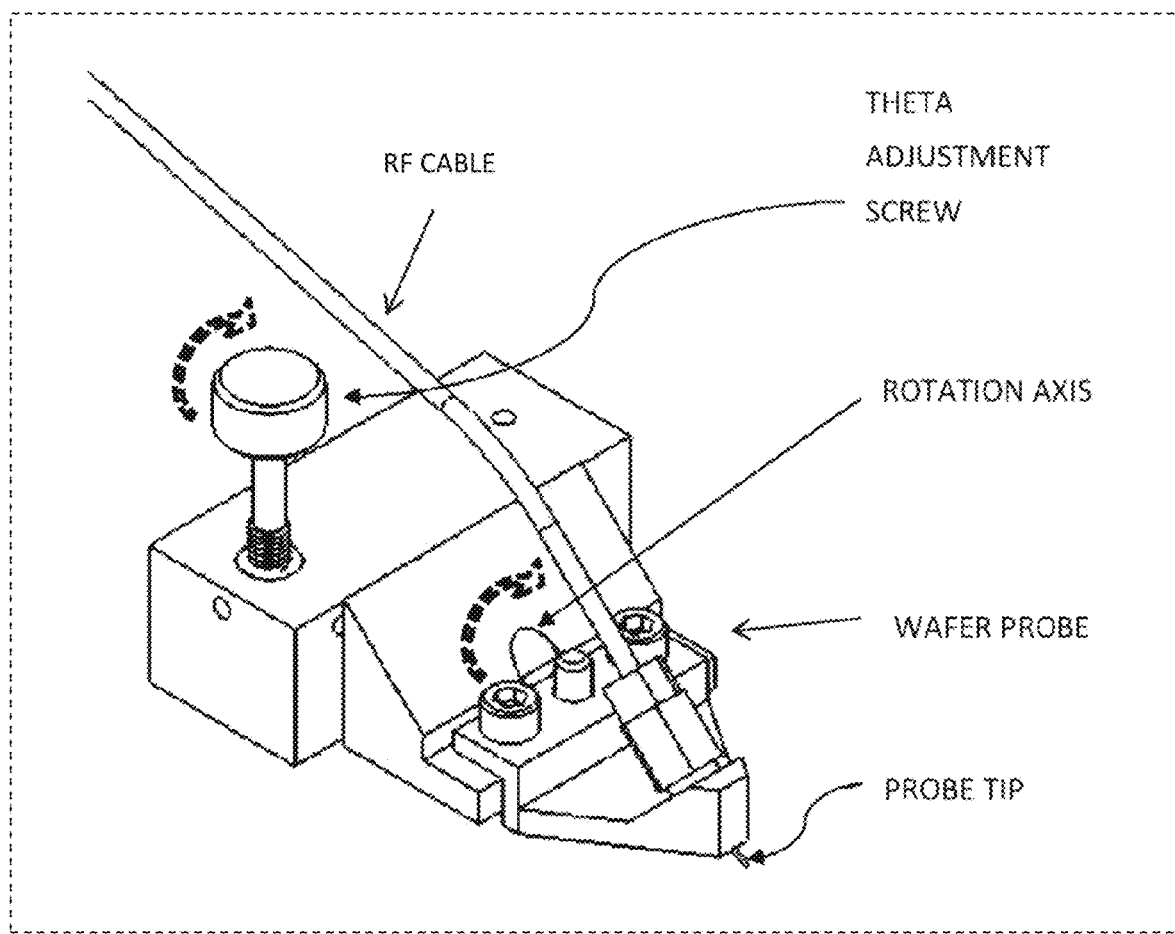
FIG. 13: Prior art

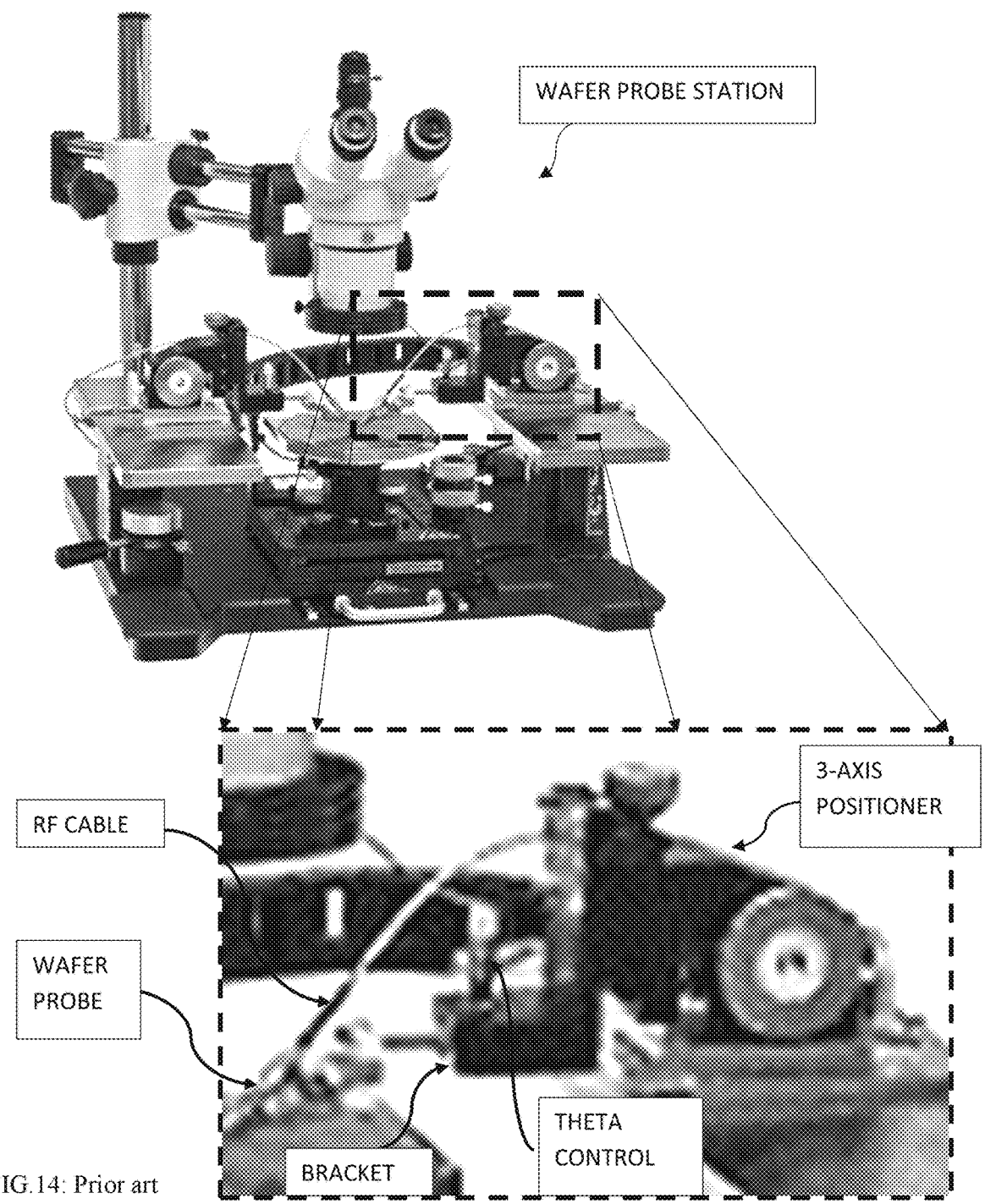
FIG.14: Prior art

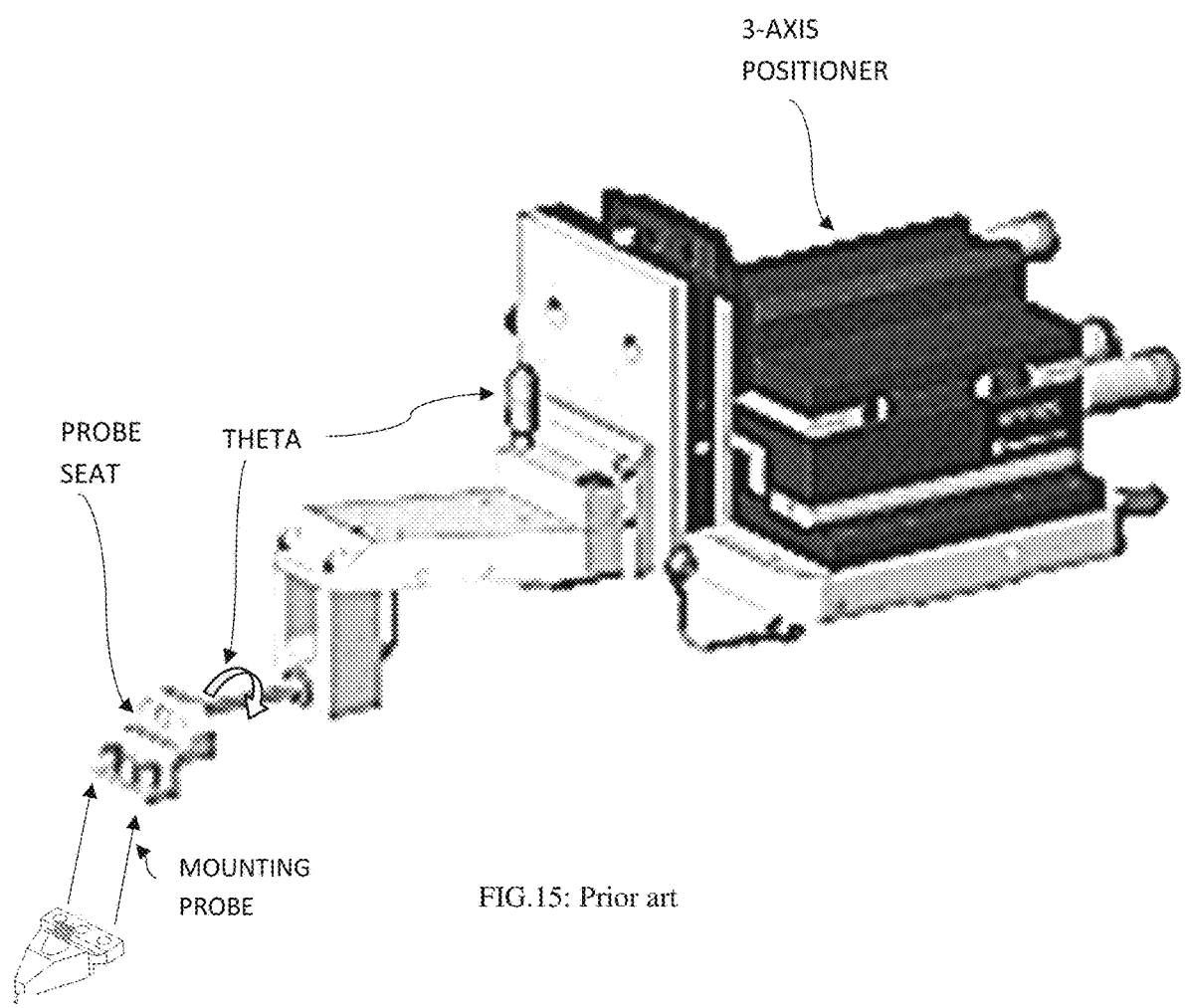
FIG.15: Prior art

FIG. 16A: Prior art
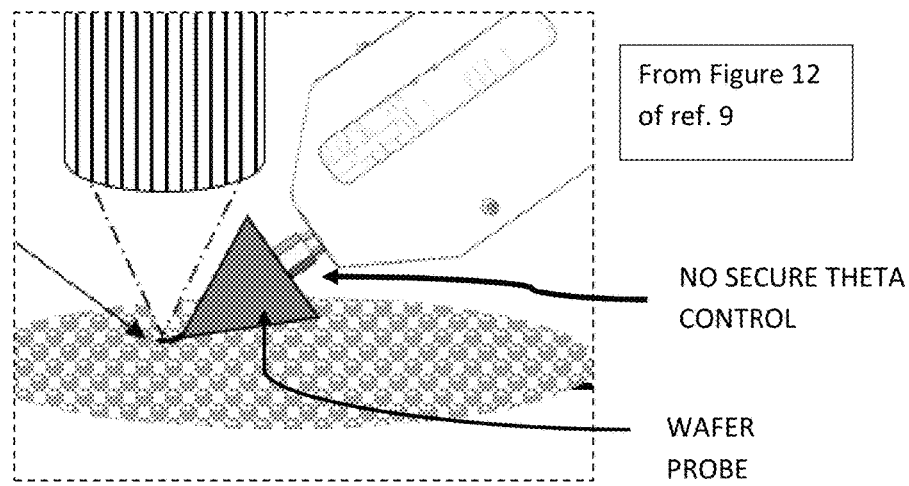
FIG. 16B
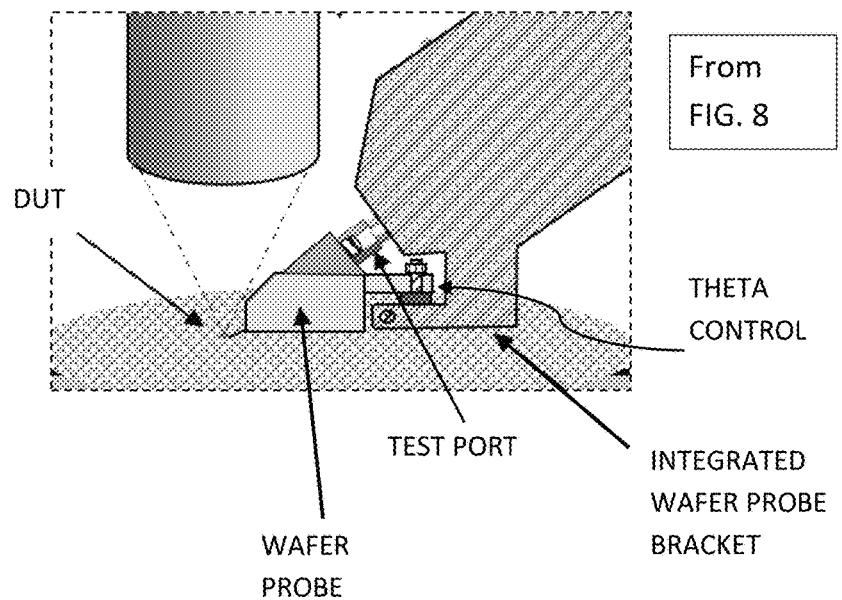

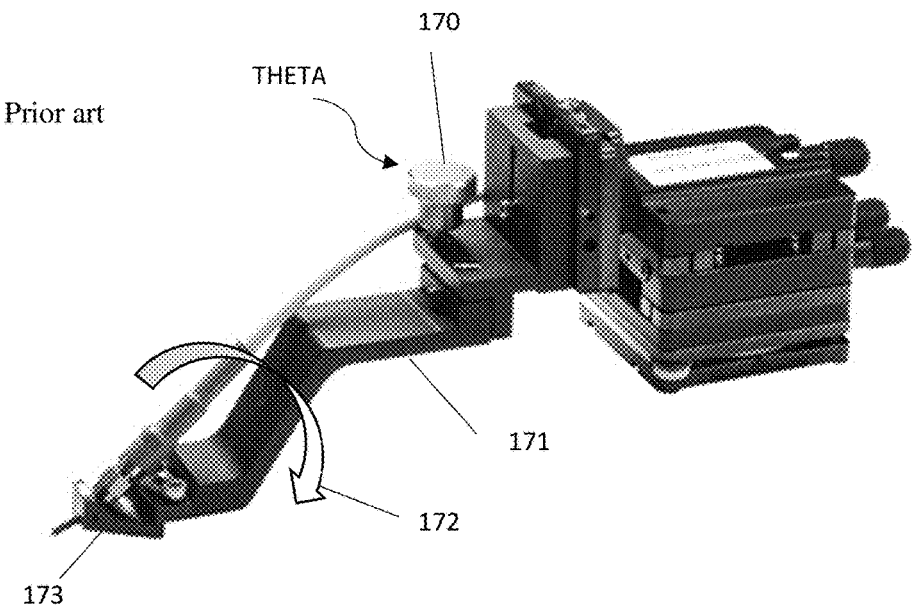
FIG. 17A: Prior art
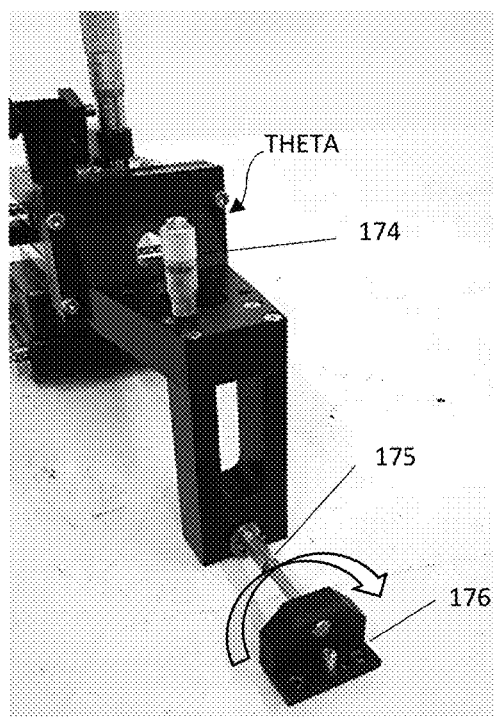
FIG. 17B: Prior art
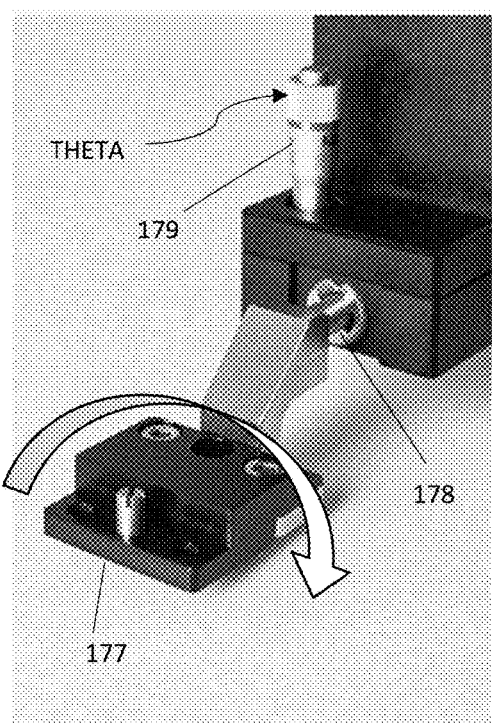
FIG. 17C: Prior art

WAFER PROBE INTEGRATION WITH LOAD PULL TUNER

PRIORITY CLAIM

Not applicable.

CROSS-REFERENCE TO RELATED ARTICLES

1. "Load Pull" [online] Wikipedia, [Retrieved on 2017 Aug. 24]. Retrieved from Internet <URL: https://en.wikipedia.org/wiki/Load_pull>.
2. "Computer Controlled Microwave Tuner, CCMT", Product Note 41, Focus Microwaves Inc. 1998, pages 2-4.
3. "Standing wave ratio" [online], Wikipedia, [Retrieved on 2017 Feb. 3]. Retrieved from Internet <URL: https://en.wikipedia.org/wiki/Standing_wave_ratio>.
4. Tsironis, U.S. Pat. No. 6,674,293, "Adaptable pre-matched tuner system and method".
5. "MPT, a universal Multi-Purpose Tuner", Product Note 79, Focus Microwaves Inc., October 2004.
6. "On Wafer Load Pull Tuner Setups: A Design Help", Application Note 48, Focus Microwaves, December 2001, page 2 ff., FIG. 2.
7. "ACP40-GSG-xxx Probes", Brochure PN 153-231-B [online], FormFactor [Retrieved on 2021 Apr. 14]. Retrieved from Internet <URL:https://formfactor.com/download/acp-quick-guide/?/wpdmdl=3524&refresh=60764fb91b8a31618366393)>.
8. Load Pull Characterization, White Paper #64, Focus Microwaves Inc., Chapter 2, pp. 13-15, Chapter 9, pp. 43-49.
9. Tsironis, C. U.S. Pat. No. 10,686,239, "Slide screw tuners with offset tuning probes and method", FIGS. 10, 12.
10. Tsironis, C. U.S. Pat. No. 9,335,345, "A Method for Planarity Alignment of Waveguide Wafer Probes".
11. Tsironis, C. U.S. Pat. No. 9,653,332, "Wafer probe holder for planarity and orientation adjustment", FIG. 3.

BACKGROUND OF THE INVENTION

This invention relates to load and source pull testing of low noise and medium and high-power RF transistor and amplifiers chips on semiconductor wafers using remotely controlled electro-mechanical impedance tuners.

Modern design of low noise and high-power RF amplifiers used in various communication systems, requires accurate knowledge of the active device's (transistor's) characteristics. In such circuits, it is insufficient for the transistors, which operate in their low noise or highly non-linear regime, close to power saturation, to be described using noise or non-linear numeric models only.

A popular method for testing and characterizing such high-power microwave and millimeter-wave transistors (DUT, device under test) is "load pull" (FIG. 1). Low noise transistors are tested using "source pull". Load or source pull is a measurement technique employing impedance tuners 2, 4 and other test equipment, such as signal or noise sources 1, test fixtures housing a DUT 3, and power meters or low noise receivers 5, the whole controlled by a computer 6; the computer controls and communicates with the tuners 2, 4 and the other equipment 1, 5 using digital cables 7, 8, 9. The tuners are used in order to manipulate the microwave impedance conditions in a systematic and controlled manner under which the DUT is tested (see ref. 1); impedance tuners allow determining the optimum impedance conditions for designing amplifiers and other microwave components for specific performance targets, such as noise parameters, gain, efficiency, inter-modulation etc. for devices in chip-form preferably on-wafer (see ref. 6).

Impedance tuners (FIG. 3 and ref. 2 and 9) use, in general, the slide-screw concept, wherein one or more adjustable tuning probes 33 (see ref. 4 and 5) are inserted in a slotted transmission airline (slabline) 32 having two sidewalls, a test port 36 and an idle port, a center conductor 34 (see ref. 4 and FIG. 5); the tuning probe (slug) 33 is attached to a precision vertical axis 31, which is mounted in a mobile carriage 38, using an extension bracket 35; the axis 31, controlled by motor 39 can move the probe 33 vertically in Y direction, starting at the top and moving towards the center conductor 34; the carriage 38 can move the probe 33 horizontally (in X direction) either towards or away from the test port 36 (and the DUT, which is attached to the test port) parallel to the center conductor 34. The vertical movement Y changes the amplitude of the reflection factor α, seen at the tuner test port 36, whereas the horizontal movement X changes its phase. This way a large portion of the Smith chart (FIG. 2) is covered, and the high movement resolution of the control mechanics allows synthesizing a large number of impedances from a minimum complex impedance Zmin to a maximum Zmax at any given frequency within the "tuning and frequency range" of the tuner. Typical values of state-of-the-art tuners are Real(Zmin)=2Ω and Real(Zmax)=1250Ω; this corresponds to a Voltage Standing Wave Ratio (VSWR) of 25:1 (see ref. 3). The relation between reflection factor Γ and impedance Z is given by $$\Gamma=|\Gamma|*\exp(j\varphi)=(Z-Zo)/(Z+Zo) \quad \{eq.1\},$$

wherein Z is the complex impedance Z=R+jX and Zo is the characteristic impedance (typically 50 Ohm). |Γ| varies between 0 and 1; the intrinsic 22 tuning range |Γmax| of the tuner is reduced to the effective 23 tuning range $\Gamma_{DUT}$ at the DUT reference plane by the insertion loss 10, 11 between the tuner and the DUT (FIGS. 1, 2 and 5).

To minimize this insertion loss two prior art methods (see ref. 8 pages 32-33 and ref. 9) have been employed: (a) moving the tuning probe 33 as close to the tuner test port 36 as much as physically possible, and (b) eliminating the RF cable (FIGS. 5 and 13) by tilting and connecting the tuner directly to the wafer probe (FIGS. 8-10). To be able to move the tuner body close to the wafer probe and thus eliminating the RF cable (FIG. 5) one needs to reduce the tuner profile (FIG. 8). One way for doing this has been described in ref. 9. Herein the vertical stepper motor 39 has been moved behind the carriage 38 and the slabline 32 has been attached externally protruding towards the DUT. A realistic view of the low-profile tuner is shown in FIG. 4. For practical reasons the housing 37 has been redesigned to include and protect the protruding slabline 32 as shown in FIG. 8.

However, if the wafer-probe (see ref. 7) is connected to the tuner simply by directly joining the coaxial connector 61 of the probe with the coaxial adapter 92 of the tuner test port, as depicted in FIG. 16A and (FIG. 10 or 12 of ref. 9), then (a) the joining is not going to be secured and (b) planarity adjustment (FIGS. 7A and 7B) is uncontrollable and possible only by feeling the tightening torque applied by hand between the two connectors. A secure method for controlling the planarity is commercially available (FIGS. 13, 16, 17), however, it is cumbersome and requires a lossy RF cable to connect to the tuner (FIGS. 5, 13, 17A), creating this way an insertion loss 10, 11 and a reduction of the tuning range (FIG. 2). The optimum overall solution is, therefore, a low-profile tuner as follows:

(i) having protruding tuning probe placed closest to the test port (see ref. 9), as shown in FIG. 3,
(ii) being mounted at an angle matching the slope of the coaxial connector of the wafer probe and connected directly to it as shown in FIG. 8, and, in addition to prior art,
(iii) including a secure integrated planarity controlling probe-holding bracket extension as in FIGS. 8-12 and 16B.

BRIEF SUMMARY OF THE INVENTION

The invention consists in a new low-profile tuner design integrating a wafer-probe bracket extension with planarity control, that can hold the wafer probe securely, with the impedance tuner mounted on a 3-axis tuner positioner under an angle matching the angle of the axis of the coaxial connector of the wafer probe. The low-profile tuner has its tuning probe operating as close as physically possible to the RF adapter of the tuner test port which is directly connected to the wafer-probe coaxial connector. The new apparatus is not an obvious combination of existing work, because it offers (a) the benefit of increasing, to the maximum possible, the tuning range, (b) the benefit of allowing simultaneous planarity (THETA) control (no prior art allows the combined (a) and (b) configuration, because of the required RF cable), and (c) eliminating the need for the extension RF cable between the instrument (tuner) and the wafer-probe, including the set of two coaxial adapters of the said cable.

The integration of the bracket extension with the tuner slabline is not obvious matter either, because there is no RF cable present, able to absorb the twisting and tilting of the wafer-probe body 116 caused by the planarity adjustment, since the rotation axis 115 of the probe body is different than the rotation axis 114 of the coaxial connector of the probe, shown in FIG. 11. This incompatibility is absorbed by the twisting, bending and tilting capacity of the flexible septum 116 and the mounting technique employed which uses adjustable positioning of the septum 116 inside the vertical slot 127 and tightening with screw 125. The slot traverses the horizontal segment of the horizontal segment of the L-shaped bracket extension 126 in which the flexible septum is inserted and is allowed to twist and tilt to absorb even small differences between bracket and probe angles.

BRIEF DESCRIPTION OF THE SEVERAL VIEWS OF THE DRAWINGS

The invention and its mode of operation will be more clearly understood from the following detailed description, when read with the appended drawings in which:

FIG. 1 depicts prior art, a typical automated transistor source and load pull test system.

FIG. 2 depicts prior art, effect of insertion loss between tuner and DUT on reducing tuning range at DUT reference plane.

FIG. 3 depicts a front view of a slide screw tuner with horizontally initialized offset tuning probe and a bracket holding the protruding tuning probe.

FIG. 4 depicts a realistic perspective 3D view of the tuning area of the tuner of FIG. 3.

FIG. 5 depicts prior art, schematic view of wafer probe connected with a load pull tuner using a RF cable and associated items.

FIG. 6 depicts prior art, a perspective view of a commercially available wafer probe and the definition of the angle Φ, being the angle between the axis of the coaxial connector and the plane of the base of the probe body.

FIGS. 7A through 7B depict prior art: a magnified view of the probe tips of a wafer probe; FIG. 7A depicts the probe tip marks on the chip connection pads; FIG. 7B depicts a front view of the probe tips and definition of planarity angle THETA.

FIG. 11A depicts horizontal position (THETA=0); FIG. 11B depicts positive THETA; FIG. 11C depicts negative THETA.

FIG. 13 depicts prior art, commercially available probe holder with THETA control and RF cable.

FIG. 14 depicts prior art, gross and detail view of integration of probe holder with 3-axis positioner.

FIG. 15 depicts prior art, commercially available probe holder with THETA adjustability controlled by 3-axis positioner.

FIGS. 16A through 16B are extracts of partly prior art, integration of wafer probe with low-profile tuner; FIG. 16A depicts prior art: extract of FIG. 12 in ref. 9, low profile tuner connected directly with wafer probe without THETA control. FIG. 16B depicts extract of FIG. 8, low profile tuner connected with wafer probe using bracket with THETA control.

FIGS. 17A through 17C depict prior art, various commercially available wafer probe positioners with THETA adjustment. They all require RF cable to connect the wafer probes with instruments, or tuners.

FIG. 19A depicts horizontal position (THETA=0); FIG. 19B depicts positive THETA; FIG. 19C depicts negative THETA.

DETAILED DESCRIPTION OF THE INVENTION

Figure 9:
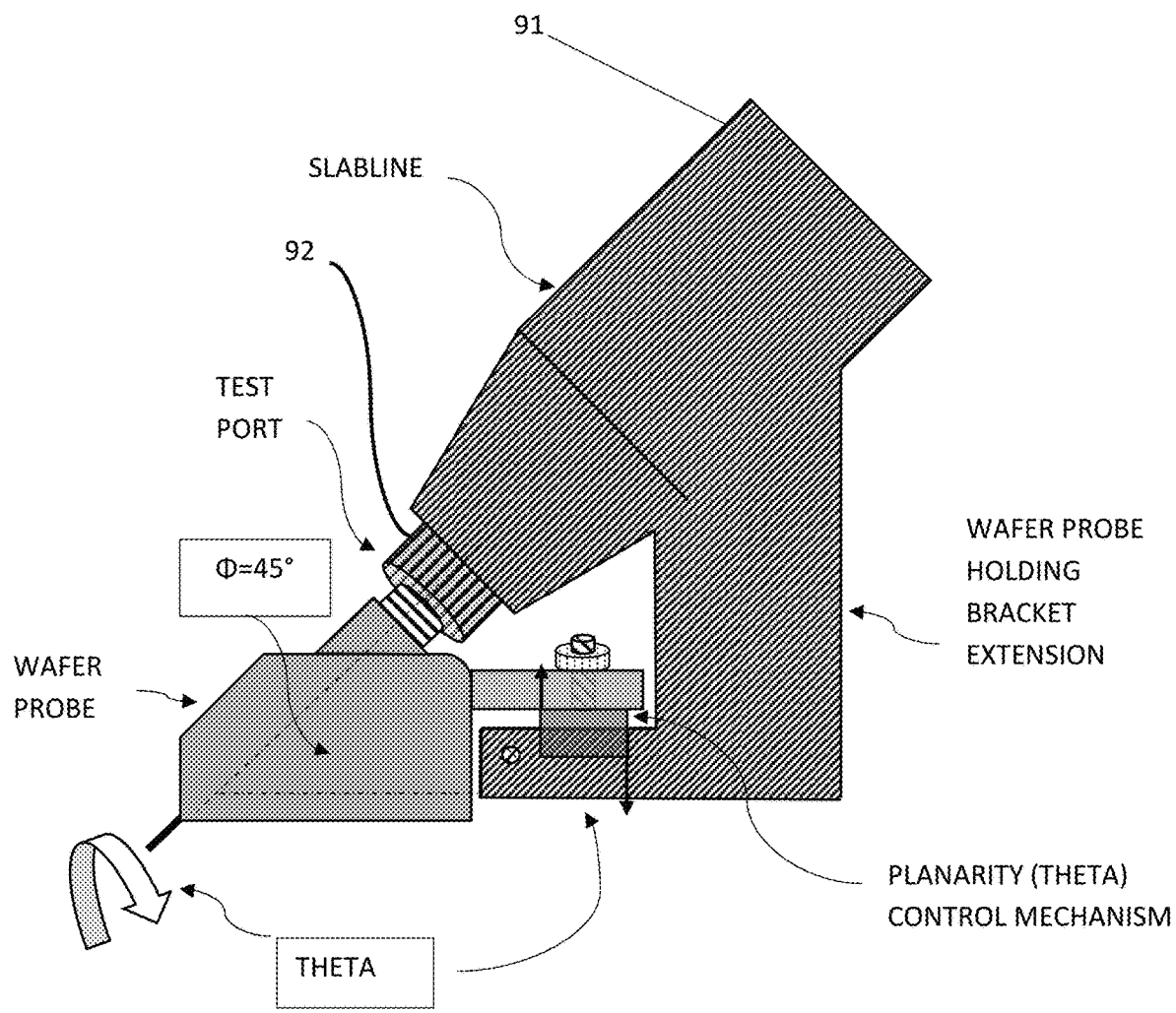
FIG. 9 depicts a conceptual view of the wafer probe and the probe holding bracket integrated with the tuner slabline using Φ=45° wafer probe.
Figure 10:
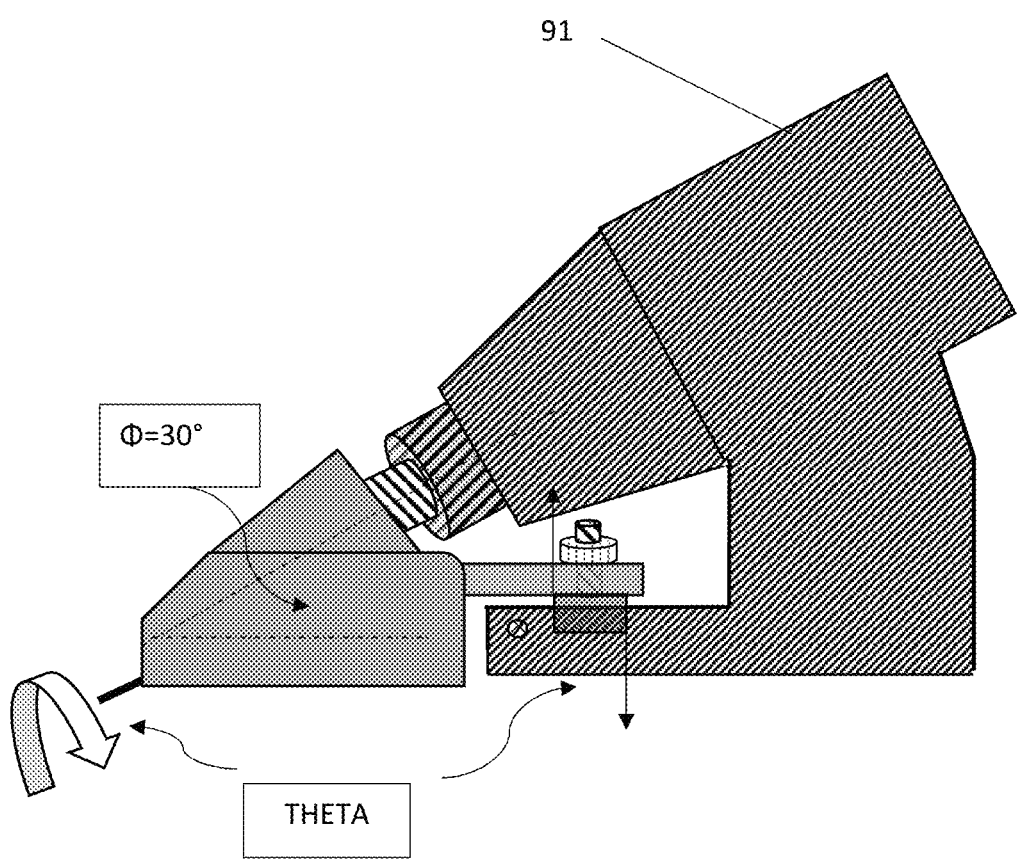
FIG. 10 depicts a conceptual view of the wafer probe and the probe holding bracket integrated with the tuner slabline using Φ=30° wafer probe.

The load pull system (FIG. 1) requires at least one impedance tuner 4 or 2 to be connected to the DUT 3 to manipulate the source and/or load impedance. The (typical chip) DUT is accessible through wafer-probes (FIG. 6). The wafer probes have a coaxial connector 61 leading directly and at minimum insertion loss, using (internally) short microscopic (1 mm) coaxial cable, to coplanar probe tips (FIG. 7). The angle (between the axis 62 of the coaxial connector 61 and the bottom plane 63 of the body of the wafer probe is a characteristic quantity of the probe (FIGS. 9 and 10). There are wafer probes with (equal 30, 45 or 90 degrees (see ref. 7); this invention deals with 30- and 45-degree probes.

Figure 8:
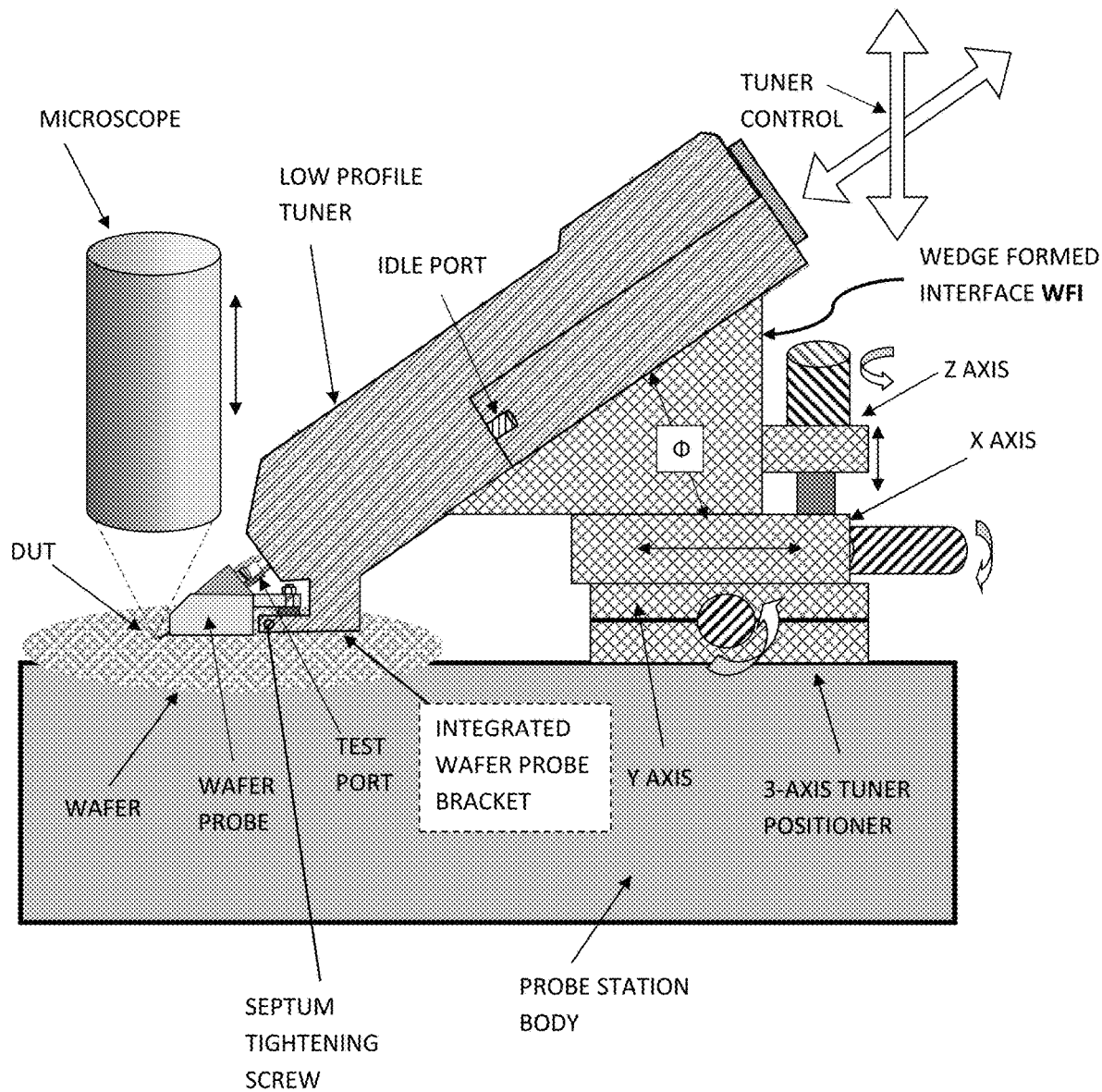
FIG. 8 depicts a low-profile tuner with integrated wafer probe holding bracket mounted on a wafer probe station.

Insertion loss 10, 11 of the connection paths between the tuners 4, 2 and the DUT 3 reduce the tuning range 22 at the tuner plane to the effective tuning range 23 at the DUT plane. The result is that a typical internal impedance 20 of the DUT cannot be conjugate matched, except if the insertion loss 10, 11 is minimized. In extreme cases, DUT with internal impedance 21 close to the limit of the Smith chart cannot be matched at all using passive tuners, instead requiring active tuning (see ref. 8). To reach tuning range close to 22 one has to minimize all insertion loss 10, 11 and place the tuning probe of the tuner as close to the test port as possible. This is shown in FIGS. 3 and 8.

FIG. 3 depicts the conceptual layout of a prior art low-profile tuner of ref. 9: In this case the tuning probe 33 is held by an extension bracket 35 and brought as close (L1) to the test port connector 36 of the tuner as mechanically possible. For this the slabline 32, including the center conductor 34, has been mounted protruding towards the DUT (test port 36) externally to the tuner housing 37, in order to gain room otherwise taken by the width of the mobile carriage 38 and the vertical axis 31 leading to a larger minimum distance L0. This way the linear insertion loss inside the tuner, between the tuning probe 33 and the test port 36 is reduced by a factor L0/L1. An actual 3D drawing of the tuner active area is shown in FIG. 4.

In hitherto art (FIG. 12 of ref. 9) the wafer probe was connected to the tuner by simply screwing and tightening the coaxial connector 61 to the tuner test port adapter 92 using some supporting alignment tool (see ref. 10) to planarize (adjust the angle THETA) the wafer probes, as shown in FIGS. 7A and 7B. Extract of the prior art method is shown in FIG. 16A and compared with extract of the new method in FIG. 16B. The planarity adjustment method in FIG. 16A is obviously based on personal feeling and trial and error, since tightening the connectors by hand may change the angle THETA. The correct approach should be to adjust and fix the planarity of the wafer-probe base using mechanical precision (fine thread screws) after tightening the connectors. This is shown in FIGS. 11 and 12.

Figure 11A:
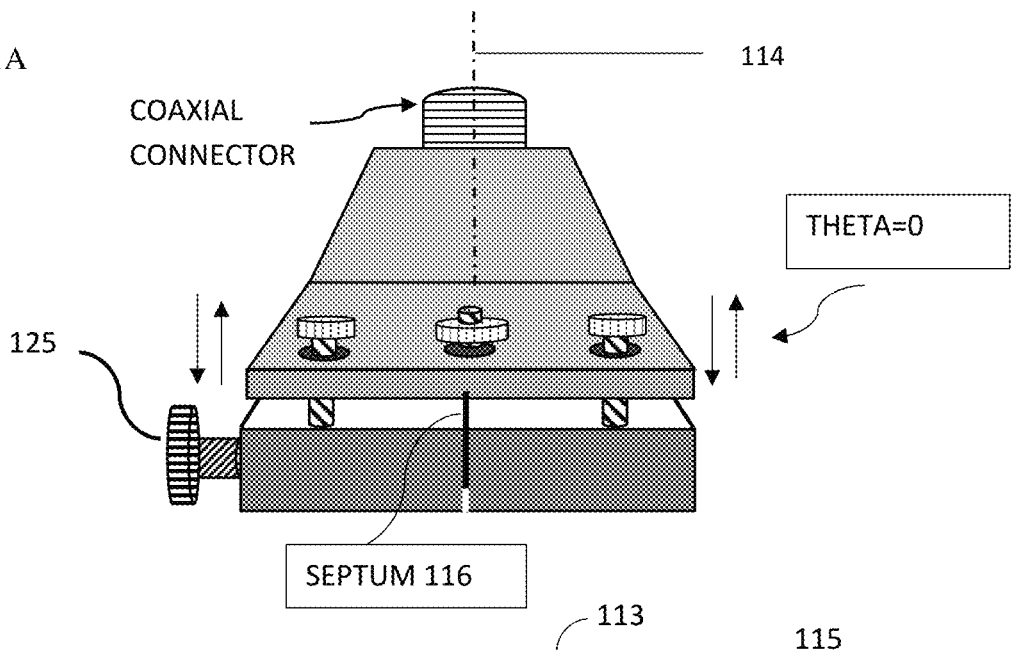
FIGS. 11A through 11C depict the THETA planarity control mechanism using two counter balancing screws.
Figure 11B:
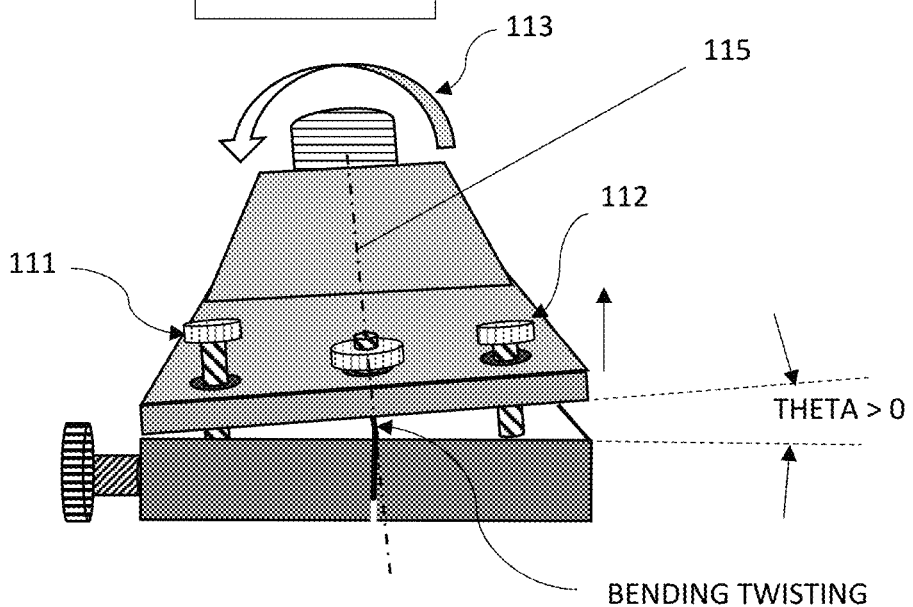
Figure 11C:
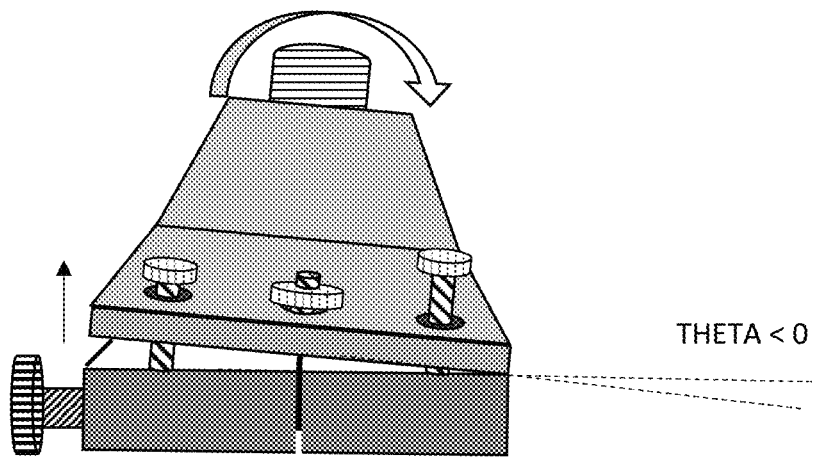
Figure 12:
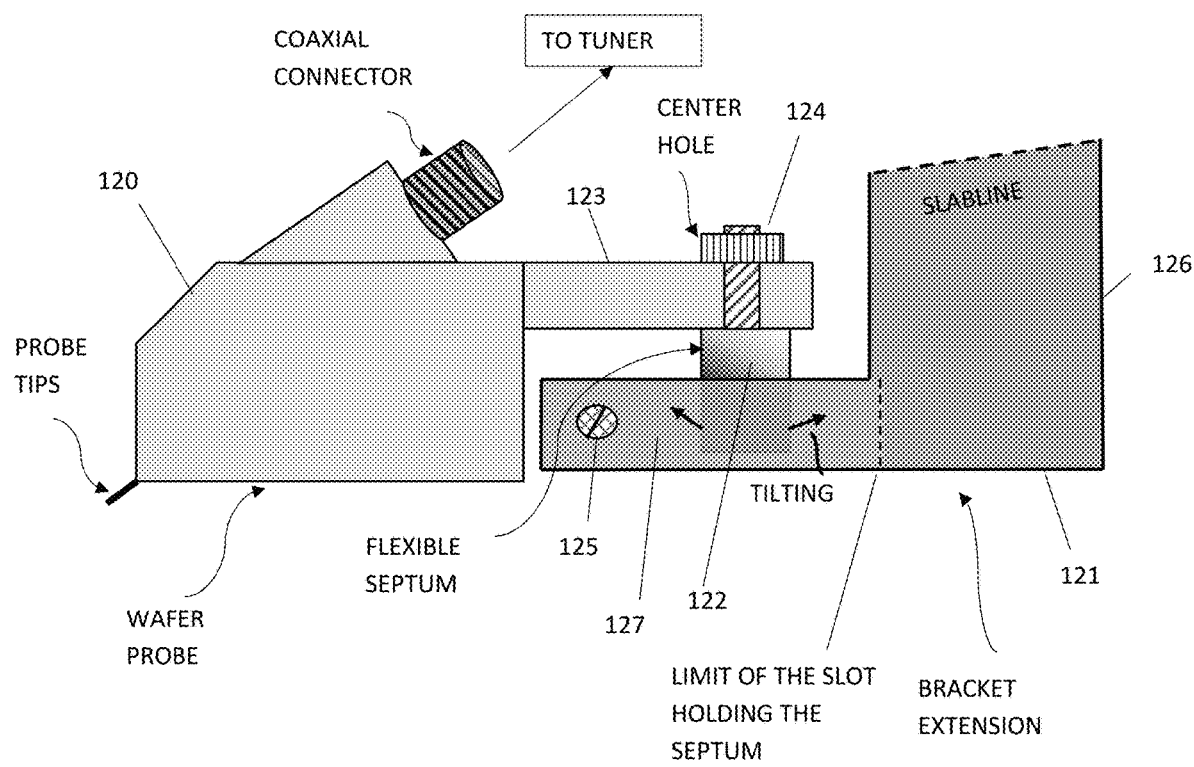
FIG. 12 depicts detail view of the integration of the probe holder (bracket) with the tuner body (slabline) and the wafer probe.
Figure 18:
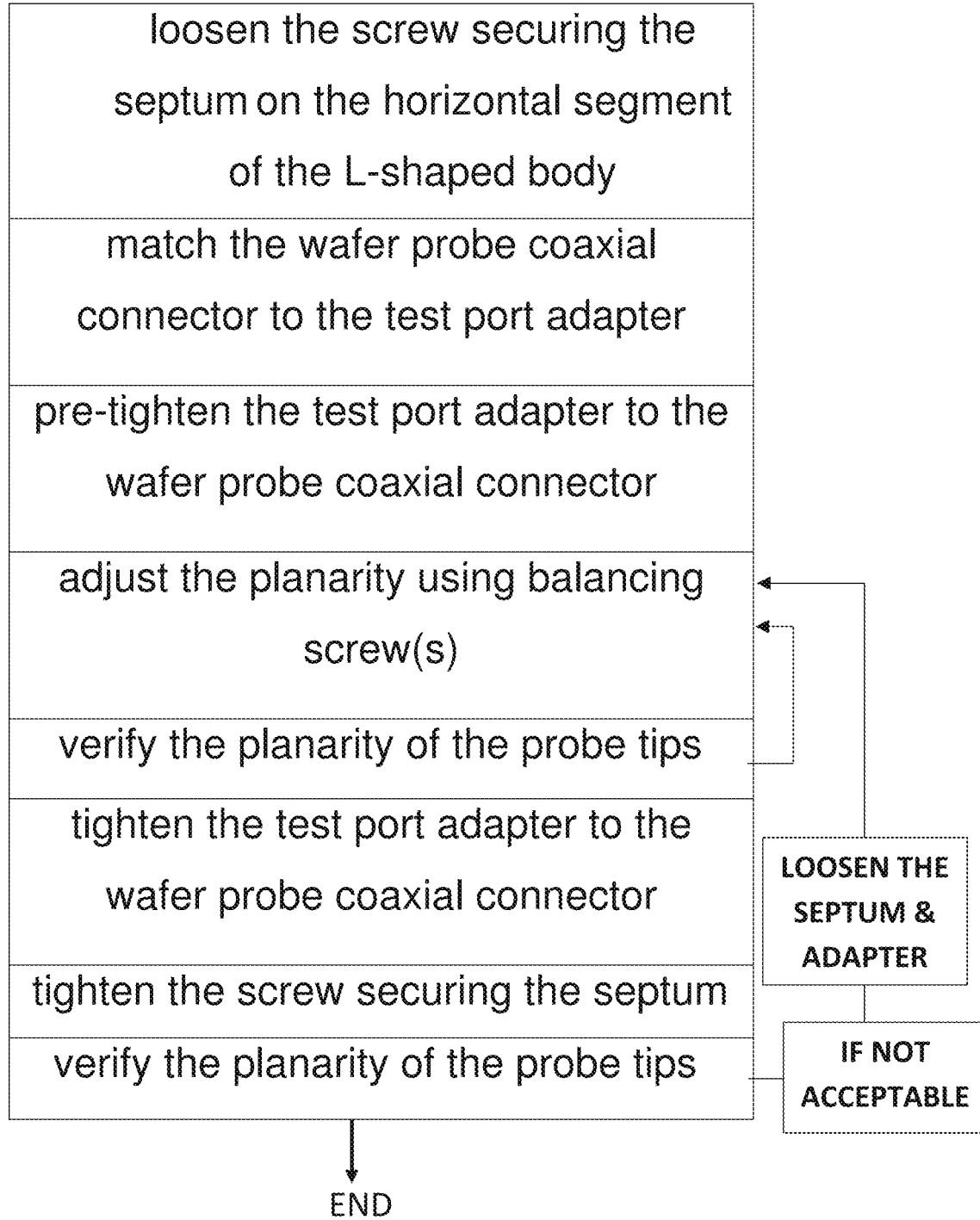
FIG. 18 depicts flowchart of THETA alignment and wafer probe securing procedure.
Figure 19A:
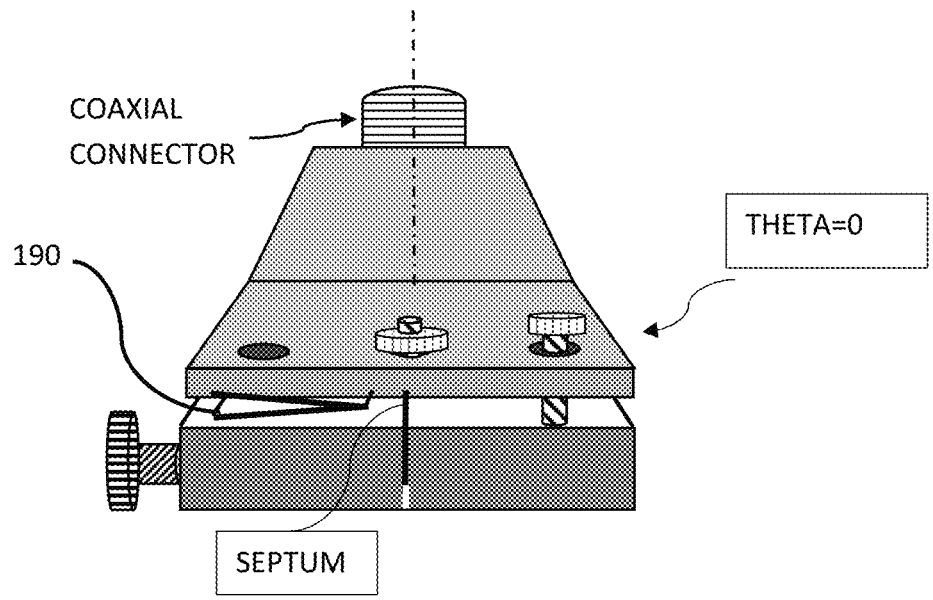
FIGS. 19A through 19C depict the THETA planarity control mechanism using a pre-loaded spring.
Figure 19B:
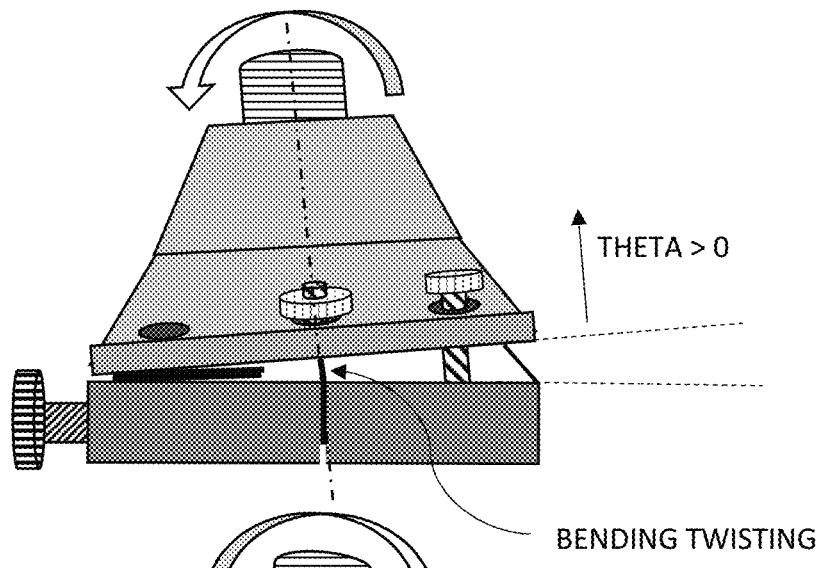
Figure 19C:
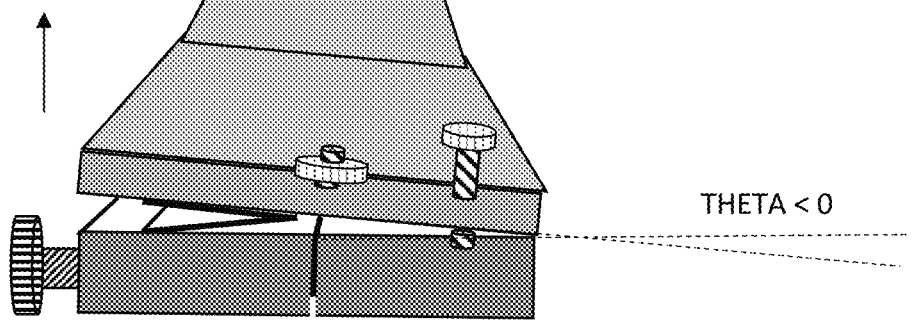

FIG. 12 shows the wafer probe body 120 supported by the L-shaped slabline extension forming the wafer probe bracket, of which the horizontal segment 121 is attached underneath the probe overhang 123 and continues as the slabline of the tuner upwards 126. The link between the overhang 123 of the wafer probe and the horizontal segment 121 of the bracket is a flexible, preferably steel, thin septum 122, which is firmly attached to the wafer probe overhang 123 using screw 124. The horizontal segment 121 of the bracket extension is slotted vertically parallel to the slabline axis up to the limit 127 and the septum 122 is inserted in the slot and secured using perpendicular screw 125, which tightens the slot's jaws, after final planarity adjustment (FIG. 18). The space 110 (FIG. 10) between the bottom of the overhang 123 and the top of the bracket extension is left free to allow some twisting and bending of the septum 122 (FIG. 11) to allow absorbing small amounts of twisting, bending and tilting created by the rotation of the coaxial connector 113 against the nominal rotation axis of the body 114, since their rotation axes are slightly different. This allows for the septum 122 to be inserted, tilted, twisted, moved to the right position and secured using screw 125 after the coaxial connector of the wafer probe is pre-tightened to the coaxial adapter of the tuner test port 92 (FIGS. 4, 8 and 9). The screw 124 holding the septum 122 is inserted into the center hole 60 of the wafer probe overhang 64, 123, while the remaining two holes of the overhang receive the two planarity controlling counter-balancing screws 111 and 112 (FIG. 11B). In an alternative embodiment (FIG. 19) one of the two counter-balancing screws 111 or 112 is replaced by a strong folded steel spring 190, preloaded to lift one side of the probe overhang against the opposite side and thus facilitating the alignment and allowing for continuous precise and secure planarity control using a single screw. The three extreme planarity settings are shown in FIG. 11A through 11C and FIGS. 19A through 19C: FIGS. 11A/19A shows balanced setting (THETA=0), FIGS. 11B/19B shows maximum positive THETA and FIGS. 11C/19C shows maximum negative THETA. Typical maximum values of THETA range settings is ±5° to ±7°.

The THETA alignment and securing procedure (depicted in the flowchart of FIG. 18) proceeds as follows: (a) the screw 125, securing the septum 122, is loosened; (b) the wafer probe with the septum 122, secured on the overhang 123, is inserted and connector 61 is screwed (but not yet tightened) on the test port adapter 92 of the already in nominal slope (angle (D) mounted and positioned tuner; (c) the screws 111 and 112 (or one screw against the force of the pre-loaded spring 190) are/is adjusted for the THETA angle to compensate any wafer probe tips mis-planarity (this is done under microscope by observing the initial contact marks on a chip contact pad, as shown in FIG. 7A and FIG. 3 of ref. 11); (d) the tuner test port adapter is tightened on the coaxial connector 61; (e) the screws 111 and/or 112 are/is tightened; (f) the septum 122 is secured using screw 125 and the planarity verified as in step (c). The procedure is repeated until the verification of step (c) provides acceptable planarity. During this procedure the septum 122 will be tilted and bent inside the slot of the horizontal segment 121 and slightly twisted after tightening the screw 125. This procedure allows secure, permanent, mechanically fine positioning for acceptable planarity of the wafer probe tips.

FIGS. 9 and 10 show tuner and probe mounting configurations for 45° and 30° wafer probes. The settings are equivalent, provided that the slabline 91 of the tuner has the appropriate bracket extension integrated and tuner itself has been pivoted by the 3-axis positioner to match the wafer probe angle and held in place using a large tuner wedge-formed interface WFI (FIG. 8).

FIGS. 13-17 aid to emphasize the differences between the proposed apparatus and prior art: FIG. 13 shows a commonly available solution. This configuration, as all known alternatives shown in FIGS. 14, 15 and 17A through 17C, do not allow direct attachment of the wafer probe to external instruments, which, in particular for electro-mechanical passive impedance tuners, is prohibitive, due to the already discussed insertion loss of the required RF cables. Even though the RF cables are shown only in FIGS. 13, 14 and 17A, they are always required. FIGS. 17A through 17C show a number of variants, all using the same principle: Screw 170 in FIG. 17A, tilts the link 171 and thus the THETA angle 172 of the wafer probe 173. In FIG. 17B the micrometric screw 174 rotates the axis 175 using an internal, not shown, mechanism and the probe seat 176 with the same effect. In FIG. 17C the micrometric screw 179 does the same to the probe seat 177 via the axis 178.

Obvious alternative embodiments to the herein disclosed apparatus and method combining (a) low profile slide screw tuners, which use extension brackets for the tuning probes, (b) the method of mounting the tuners on probe stations for perfect alignment and direct contact with the wafer probes maximizing this way the tuning range, (c) integrating and the method for planarity adjusting a wafer probe bracket, are imaginable and possible, but shall not impede on the validity of the basic idea of the present invention.

What is claimed is:
1. A low-profile load pull tuner for on-wafer operation, comprising:
  a) a low-profile housing including electronic interface, at least one mobile carriage remotely controlled by stepper motor(s) and gear, and b) a slabline comprising:
  i) two sidewalls,
  ii) a center conductor, a test port with an adapter and an idle port, wherein
    the at least one mobile carriage slides parallel to the center conductor and has a remotely controlled, perpendicular to the center conductor moving axis, holding a metallic tuning probe insertable between the sidewalls,
  iii) a bracket extension holding a wafer probe and controlling its planarity;
wherein
  the low-profile tuner is mounted at an angle Φ matching an angle of the wafer probe, and
  the adapter of the test port of the slabline is connected directly to the wafer probe;
and wherein
  the wafer probe is attached to the bracket extension using a vertical flexible septum and a control mechanism of the planarity (THETA) of the wafer probe.

2. A method for mounting the low-profile load pull tuner of claim 1 on a wafer probe-station for highest tuning range at a DUT reference plane,
wherein
  the low-profile tuner is mounted on a 3-axis positioner using a wedge-formed interface (WFI) matching the angle Φ of the wafer probe, whereby the adapter of the test port of the slabline is screwed directly on a coaxial connector of the wafer-probe.

3. The low-profile load pull tuner of claim 1,
wherein
  the wafer probe comprises a body, a coaxial connector, an overhang and probe tips, the overhang having three vertical holes, a center hole and two side holes, all three holes being aligned perpendicular to an axis of the coaxial connector of the wafer probe;
and wherein the bracket extension holding the wafer probe comprises:
  a L-shaped body having a horizontal and a vertical segment,
  a vertical flexible septum,
  a planarity controlling mechanism;
and wherein
  the horizontal segment of the L-shaped body is attached from underneath to the wafer probe overhang using the vertical septum, which is held by a screw through the center hole of the overhang,
and wherein
  the planarity controlling mechanism comprises two counter-balancing screws inserted into the side holes of the overhang pushing against the horizontal segment of the L-shaped body.

4. The low-profile load pull tuner of claim 1,
wherein
  the wafer probe comprises a body, a coaxial connector, an overhang and probe tips, the overhang having three vertical holes, a center hole and two side holes, all three holes being aligned perpendicular to an axis of the coaxial connector of the wafer probe;
and wherein the bracket extension holding the wafer probe comprises:
  a L-shaped body having a horizontal and a vertical segment,
  a vertical flexible septum,
  a planarity controlling mechanism;
and wherein
  the horizontal segment of the L-shaped body is attached from underneath to the wafer probe overhang using the vertical septum, which is held by a screw through the center hole of the overhang,
and wherein
  the planarity controlling mechanism comprises one balancing screw inserted into one side hole of the overhang and a pre-loaded spring inserted between an area below the other side hole and the horizontal segment of the L-shaped body.

5. A method for aligning and securing the wafer probe attached to the bracket extension of the low-profile load pull tuner of claims 3 or 4, comprising the following steps:
  a) loosen a screw securing the septum on the horizontal segment of the L-shaped body;
  b) match and pre-tighten the test port adapter to the coaxial connector of the wafer probe;
  c) adjust the planarity using the balancing screw(s);
  d) verify the planarity of the probe tips;
  e) if the planarity is not acceptable go to step c);
  f) tighten the test port adapter to the coaxial connector of the wafer probe;
  g) verify the planarity of the probe tips;
  h) if the planarity is not acceptable, loosen the test port adapter and go to step c);
  i) tighten the screw securing the septum.

* * * * *